US005216209A

United States Patent [19]

Holdaway

[11] Patent Number: 5,216,209

[45] Date of Patent: Jun. 1, 1993

[54] LOUDSPEAKER SYSTEM AND METHOD FOR DISBURSING SOUNDS WAVES

[76] Inventor: Timothy A. Holdaway, 3170 Maybee Rd., Orion, Mich. 48359

[21] Appl. No.: 805,380

[22] Filed: Dec. 10, 1991

[51] Int. Cl.[5] .............. H05K 5/00

[52] U.S. Cl. .............. 181/144; 181/155; 181/156

[58] Field of Search .............. 181/144, 147, 153, 154, 181/155, 156, 191, 199; 381/160

[56] References Cited

U.S. PATENT DOCUMENTS

| | | | |
|---|---|---|---|
| 4,357,490 | 11/1982 | Dickey | 181/145 |
| 4,850,452 | 7/1989 | Wolcott | 181/144 |
| 4,907,671 | 3/1990 | Wiley | 181/156 |

*Primary Examiner*—Michael L. Gellner
*Assistant Examiner*—Khanh Dang
*Attorney, Agent, or Firm*—Brooks & Kushman

[57] ABSTRACT

A loudspeaker system 10 and a method for disbursing sound waves are disclosed. The loudspeaker system 10 has a reflector screen 12 which is provided with a concave reflective surface 14. The reflective surface 14 is a complex curve having a central axis 16. A first speaker 18 is positioned in front of the reflective surface 14 a longitudinal distance along the central axis 16 less than a pre-determined distance x. The first speaker 18 projects sound waves above a pre-determined frequency toward the reflective surface 14 to be reflected and disbursed into a listening area. A second speaker 20 is positioned to project sound waves below the pre-determined frequency into the listening area generally. A frame 24 supports the first and second speakers 18,20. A method for disbursing sound waves is also disclosed including the steps of providing a reflector screen 12 having a concave reflective surface 14 and positioning first and second speakers 18,20. The method further includes the steps of projecting sound waves from the first and second speakers 18,20 and reflecting sound waves from the first speaker 18 off of the reflective surface 14 to be disbursed into a listening area.

27 Claims, 3 Drawing Sheets

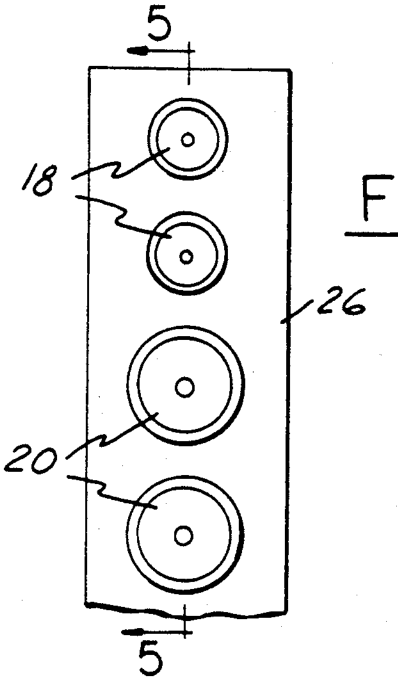
FIG.4
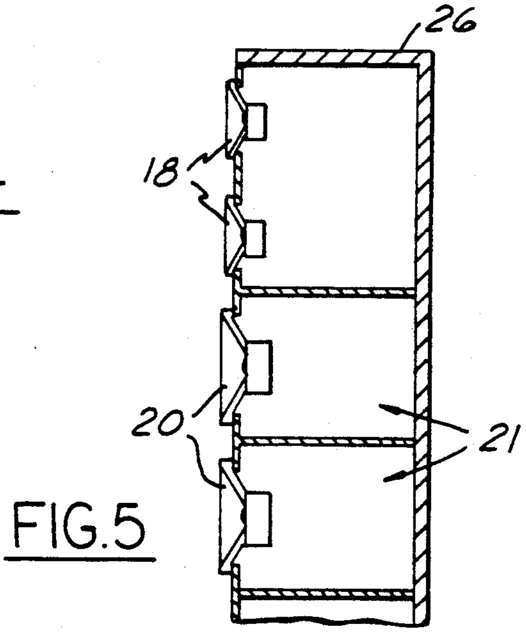
FIG.5
FIG.6
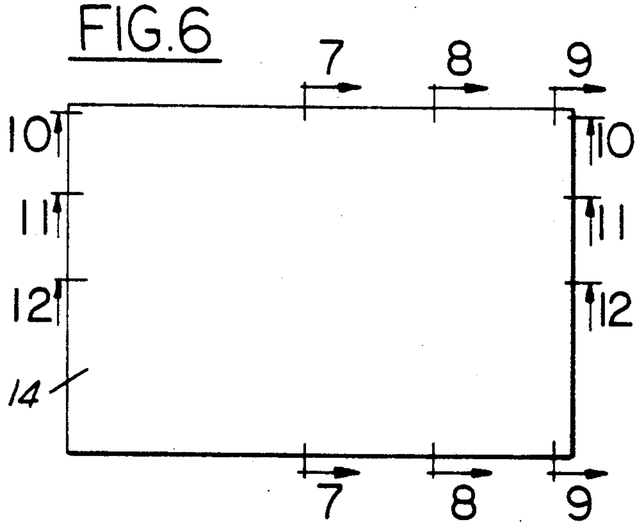
FIG.9
FIG.7
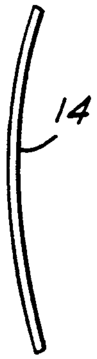
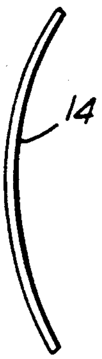
FIG.8
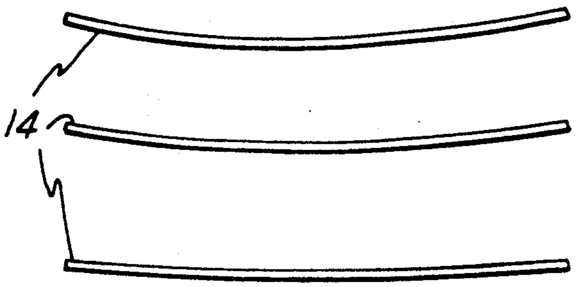
FIG.12
FIG.11
FIG.10

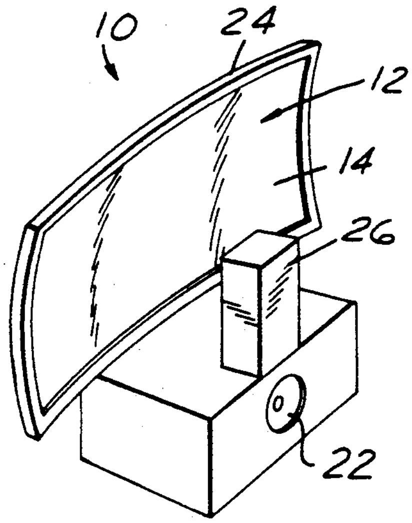
FIG. 13
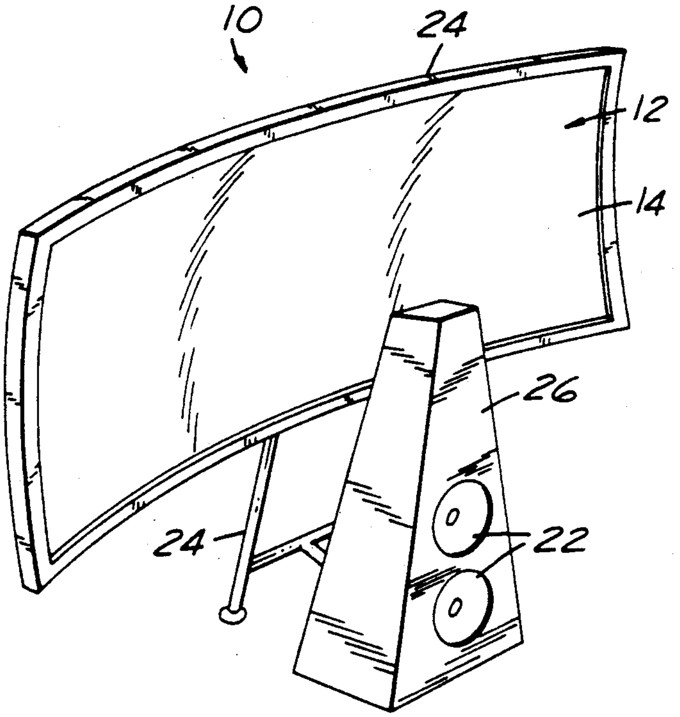
FIG. 14
FIG. 15
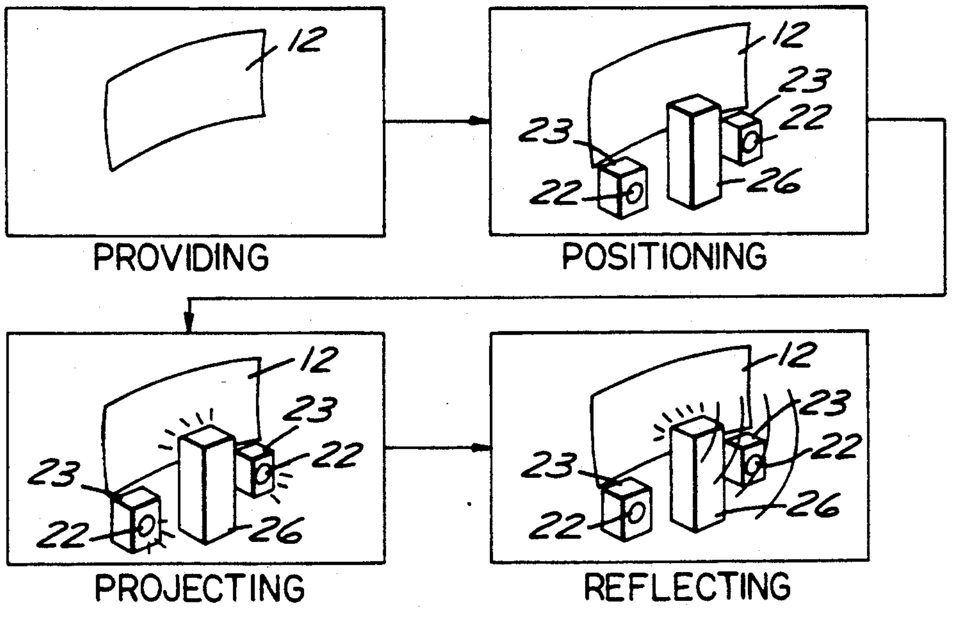

LOUDSPEAKER SYSTEM AND METHOD FOR DISBURSING SOUNDS WAVES

TECHNICAL FIELD

This invention relates generally to loudspeaker systems. Specifically, this invention relates to a method and apparatus for uniformly disbursing sound waves into a listening area through the use of a reflective surface.

BACKGROUND TO THE INVENTION

The ultimate goal of designers and manufacturers of loudspeaker systems has long been to reproduce sound that qualitatively approaches the actual sound produced during an original event. Early efforts toward improving sound reproduction included the development of stereo loudspeakers. More recent efforts along these lines have included various improvements to stereo speakers and their use.

One such development in the quest for high-fidelity sound reproduction included loudspeaker systems using various forms of reflective surfaces. U.S. Pat. No. 4,256,922 issued to Gorike discloses one such system that employs the walls of a room as passive reflective surfaces. U.S. Pat. No. 4,230,905 issued to Crum et al also discloses a system that utilizes the walls and ceiling of a room as reflective surfaces. Similarly, U.S. Pat. No. 4,805,731 issued to Staley disclose specially designed acoustical reflectors. Such reflective surfaces serve to redirect sound from essentially point source speakers toward a general listening area while simultaneously creating interference patterns that act to enhance the quality of sound reproduction.

Reflective surfaces, however, suffer from the problem of distortion associated with the reflection of low-frequency sound waves. Such distortion results from the fact that, in ordinary speakers, low-frequency sound waves are more widely dispersed than high-frequency sound waves. Various efforts have been undertaken by designers and manufacturers of loudspeaker systems to minimize such distortion. One such approach is disclosed in U.S. Pat. No. 4,227,050 issued to Wilson wherein separate reflective surfaces are dedicated to low and high-frequency sound waves respectively. These reflective surfaces are also designed into the speaker housing itself. Used in conjunction with other reflective surfaces such as the walls, ceiling and floor of a room, the quality of sound reproduction is again enhanced.

Another approach to the problem of distortion associated with the reflection of low-frequency sound waves has been to project low-frequency sound waves directly into the general listening area while simultaneously reflecting high-frequency sound waves. U.S Pat. No. 4,266,092 issued to Barker discloses such a system that utilizes the walls of a room to reflect high-frequency sound waves only in an effort to enhance the quality of sound reproduction.

Reflective surfaces of various shapes and textures have also been used to better control the reflection of sound waves as well as reduce the distortion associated with the reflection of low-frequency sound waves. U.S. Pat. No. 4,190,739 issued to Torffield discloses such a system wherein curved reflectors not only reflect sound waves but concentrate them in an optimal listening area. The use of a roughened surface on such a reflector reduces distortion of reflected low-frequency sound by reducing the angle of dispersion.

Each of the above described efforts toward high fidelity sound reproduction, however, continue to suffer from various problems including continued distortion of reflected low-frequency sound waves and/or a lack of uniform disbursement of the reflected sound waves. Reflected sound waves are often directed toward and lost in non-listening areas or concentrated in a small listening area.

As a result, the ideal method and apparatus for sound reproduction and projection would prevent distortion associated with the reflection of low-frequency sound waves by reflecting high-frequency sound waves only. The ideal method and apparatus for sound reproduction and projection would also reflect high-frequency sound waves through the use of a concave reflective surface that would maximize the uniform disbursement of sound waves into a listening area.

SUMMARY OF THE INVENTION

According to the apparatus and method of the present invention, a reflector screen is provided having a concave reflective surface. The reflective surface is generally symmetrical about a horizontal and a vertical plane, respectively. These vertical and horizontal planes intersect along a central axis. The concave reflective surface is configured such that a line drawn normal to the reflective surface at substantially any region thereon intersects both the vertical and horizontal planes at vertical and horizontal intersection points, respectively. Substantially all of these vertical and horizontal intersection points are spaced from the reflector screen a longitudinal distance along the central axis greater than some pre-determined distance x.

A first speaker is positioned in front of the reflective surface generally along the central axis a distance less than the pre-determined distance x. The first speaker is powered to produce sound waves above some pre-determined frequency. These sound waves are projected toward the reflective surface to be reflected off the reflective surface and uniformly disbursed into a listening area.

A second speaker is positioned and powered such that it produces sound waves below the pre-determined frequency that are projected into the listening area generally. Support means are also provided to support the first and second speakers relative to the reflector screen.

Accordingly, it is a principle object of this invention to provide a method and apparatus for sound reproduction that qualitatively approaches the actual sound produced during an original event.

Another object of this invention is to provide a method and apparatus for sound reproduction that is compatible with a wide variety of loudspeakers.

Another object of this invention is to provide a method and apparatus for sound reproduction that is simple in design and inexpensive to manufacture.

Another object of this invention is to provide a method and apparatus for sound reproduction utilizing reflection that eliminates distortion associated with reflection of low-frequency sound waves.

Another object of this invention is to provide a method and apparatus for sound reproduction that maximizes the uniform disbursement of sound waves in a listening area.

Another object of this invention is to provide a method and apparatus for sound reproduction that uniformly disburses sound waves into a listening area by reflecting high to mid-range frequency sound waves off a reflective surface into the listening area and by projecting low-frequency sound waves into the listening area generally.

These and other objects and advantages will be apparent after consideration of the following detailed description and drawings.

BRIEF DESCRIPTION OF THE DRAWINGS

FIG. 3 is a side view of the loudspeaker system of the present invention;

FIG. 4 is a front view of the treble and mid-range speakers of the loudspeaker system of the present invention;

FIG. 5 is a cross-sectional view of the treble and mid-range speakers of the loudspeaker system of the present invention, taken along line 5—5 of FIG. 4;

FIG. 6 is a front view of the reflective surface of the loudspeaker system of the present invention;

FIG. 7 is a cross-sectional view of the reflective surface of the loudspeaker system of the present invention, taken along line 7—7 of FIG. 6;

FIG. 8 is a cross-sectional view of the reflective surface of the loudspeaker system of the present invention, taken along line 8—8 of FIG. 6;

FIG. 9 is a cross-sectional view of the reflective surface of the loudspeaker system of the present invention, taken along line 9—9 of FIG. 6;

FIG. 10 a cross-sectional view of the reflective surface of the loudspeaker system of the present invention, taken along line 10—10 of FIG. 6;

FIG. 11 is a cross-sectional view of the reflective surface of the loudspeaker system of the present invention, taken along line 11—11 or FIG. 6;

FIG. 12 is a cross-sectional view of the reflective surface of the loudspeaker system of the present invention, taken along line 12—12 of FIG. 6;

FIG. 13 is a perspective view of an alternative embodiment of the loudspeaker system of the present invention;

FIG. 14 is a perspective view of another alternative embodiment of the loudspeaker system of the present invention; and FIG. 15 is a block-diagram representation of the method of disbursing sound waves of the present invention.

DETAILED DESCRIPTION OF THE INVENTION

Figure 1:
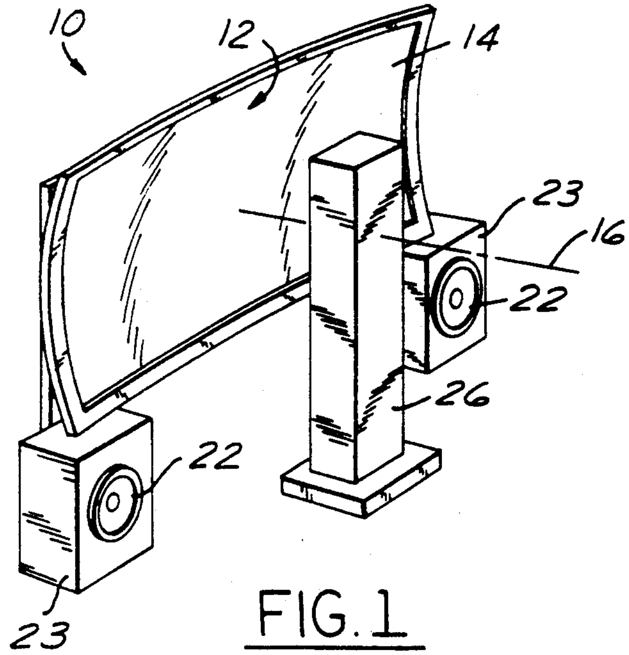
FIG. 1 is a perspective view of the loudspeaker system of the present invention.

Referring now to FIG. 1, the loudspeaker system 10 of the present invention is shown. A reflector screen 12 is provided having a concave reflective surface 14. The reflective surface 14 is generally symmetrical about a vertical plane and a horizontal plane, respectively. These vertical and horizontal planes intersect along a central axis 16. A line drawn normal to the reflective surface 14 in substantially any region thereon intersects the vertical and horizontal planes of the reflective surface 14 at a vertical and a horizontal intersection point, respectively. These vertical and horizontal intersection points each have a certain longitudinal component of distance along the central axis 16. A pre-determined distance x is the distance along the central axis 16 that is closer to the reflective surface 14 than the longitudinal component of distance along the central axis 16 of substantially all of the vertical and horizontal intersection points.

The concave reflective surface 14 of the reflector screen 12 is a complex curve having a variable radius of curvature that is generally smaller along most vertical planes through the reflective surface 14 than along most horizontal planes through the reflective surface 14. As more fully described below, this feature of the reflective surface 14 serves to minimize the disbursement of sound waves toward the ceiling and floor of any room utilized as a listening area.

The reflector screen 12 and the concave reflective surface 14 may be constructed from a variety of materials including fiberglass. In the present invention, the reflector screen 12 and reflective surface 14 are preferably constructed from a rigid plastic. Additionally, the reflector screen 12 may have various dimensions depending on the location wherein the loudspeaker system 10 of the present invention will be utilized. In the present invention, the reflector screen 12 has a width of 48 inches and a height of 37 inches for optimal use in any standard size room of an ordinary dwelling.

Figure 2:
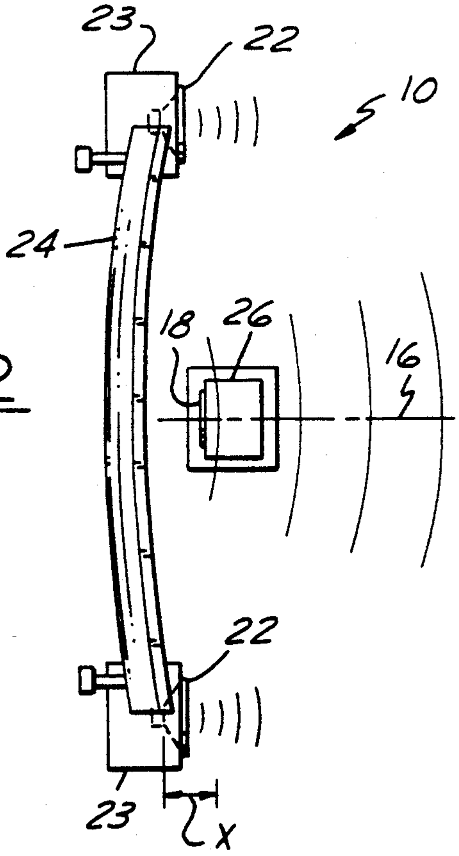
Figure 3:
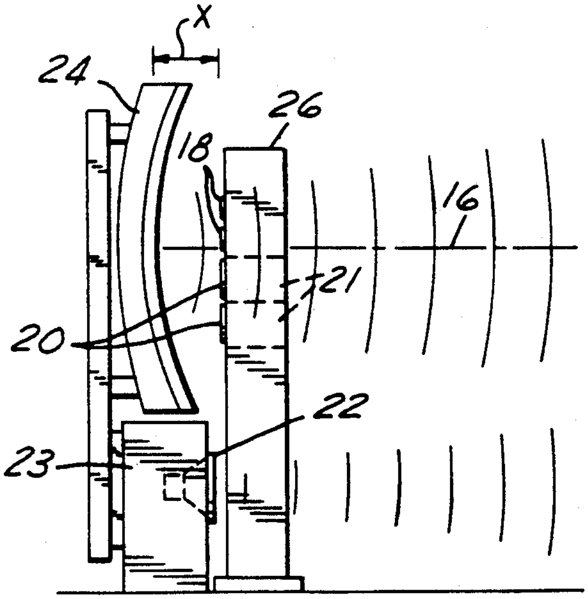
FIG. 3 is a top view of the loudspeaker system of the present invention.

As shown in FIGS. 2 and 3, a pair of treble speakers 18 and a pair of mid-range speakers 20 are positioned in front of the reflective surface 14 generally along the central axis 16. The treble and mid-range speakers 18, 20 are speakers of conventional design well known in the art. In the present invention, the treble speakers 18 are 1 inch sealed tweeters manufactured by Pyle and designated with part number KD3580. The mid-range speakers 20 are 5 inch mid-range woofers also manufactured by Pyle and designated with part number M516. In the present invention, the treble speakers 18 reproduce sound waves above 5000 hertz and the mid-range speakers 20 reproduce sound waves between 800 and 5000 hertz. This is accomplished through the use of standard electronic crossover circuitry. For higher quality sound reproduction, the mid-range speakers 20 are contained within sealed resonance cavities 21. The optimum volume of the resonance cavity 21 will vary depending on the make of mid-range speaker 20 used. In the present invention, the resonance cavity 21 has a volume of approximately 0.91 cubic feet.

The treble and mid-range speakers 18, 20 are spaced from the reflective surface 14 a longitudinal component of distance along the central axis 16 less than the pre-determined distance x. As previously described, the value of the pre-determined distance x is set by the specific nature of the complex curvature of the reflective surface 14. The above explained placement of the treble and mid-range speakers 18, 20 ensures that sound waves directed by the treble and mid-range speakers 18, 20 toward the reflector screen 12 will be reflected off the reflective surface 14 and uniformly disbursed into the listening area. Placement of the treble and mid-range speakers 18, 20 in front of the reflective surface 14 at a longitudinal component of distance greater than the pre-determined distance x will result in concentration, rather than the desired disbursement, of the sound waves produced by the treble and mid-range speakers 18, 20. In the present invention, the pre-determined distance x has a value of approximately 12.5 inches, but may be vary in the range of 0.75 to 2.0 feet.

Referring again to FIGS. 1-3, a pair of bass speakers 22 are shown. The bass speakers 22 are also speakers of conventional design well known in the art. In the present invention, the bass speakers 22 are 8 inch woofers manufactured by Pyle and designated with part number WP830. For better quality sound reproduction, the bass speakers 22, are also contained in sealed resonance cavities 23. To prevent distortion of reflected low-frequency sound waves, the bass speakers 22 are positioned to project sound waves into the listening area generally rather than reflecting sound waves off of the reflective surface 14. In the present invention, the bass speakers 22 reproduce sound waves below 800 hertz to be directed into the listening area generally. As previously described, this is accomplished through the use of standard crossover electronic circuitry.

FIGS. 1–3 also show a frame 24. The frame 24 is provided to support the reflector screen 12 in a generally vertical orientation relative to ground. When the reflector screen 12 is constructed from fiberglass, the frame 24 also serves to maintain the required curvature of the reflective surface 14. In the present invention, the frame 24 connects the reflector screen 12 to the bass speakers 22 and supports the lower edge of the reflector screen 12 at a height above the floor of approximately 24 inches. However, as is readily apparent, the frame 24 may also support the reflector screen 12 independent of placement of the bass speakers 22 at a variety of heights and angles of orientation.

A pedestal 26 is also shown in FIGS. 1–3. The pedestal 26 supports the treble and mid-range speakers 18, 20 in front of the reflective surface 14 of the reflector screen 12 a longitudinal component of distance along the central axis 16 less than the pre-determined distance x. In the present invention, the pedestal 26 is a free standing square column approximately 52 inches high and 6.5 inches in width and length. Once again, however, it is readily apparent that these features may vary as long as the pedestal 26 supports the treble and mid-range speakers 18, 20 in front of the reflective surface 14 generally along the central axis 16 a longitudinal component of distance less than the pre-determined distance x.

Referring now to FIGS. 4 and 5, the configuration of the treble and mid-range speakers 18, 20 of the present invention is shown. The treble and mid-range speakers 18, 20 can be arranged linearly either vertically or horizontally in various patterns. In addition, the treble and mid-rang speakers 18, 20 may also be arranged in various non-linear patterns.

Referring now to FIGS. 6–12, the reflective surface 14 of the reflector screen 12 is shown. FIGS. 7–9 show various vertical cross-sections of the reflective surface 14 while FIGS. 10–12 show various horizontal cross-sections of the reflective surface 14. The reflective surface 14 is provided with a complex curvature wherein the radius of curvature generally decreases approaching the central axis 16 in either a vertical or horizontal plane. Additionally, the reflective surface is generally provided with smaller radii of curvature in most vertical planes than in most horizontal planes. The more pronounced curvature of the reflective surface 14 along vertical planes creates a reduced vertical angle of disbursement for reflected sound waves produced by the treble and mid-range speakers 18, 20. As a result, the disbursement of reflected sound waves toward the ceiling and floor of a room utilized as a listening area is minimized.

FIGS. 13 and 14 show two alternative embodiments of the present invention. In particular, FIG. 13 shows the use of a singular bass speaker 22 from which the frame 24 and the pedestal 26 each depend. The frame 24 once again supports the reflector screen 12. FIG. 14 shows the use of bass speakers 22 integrated with the treble and mid-range speakers 18, 20 as part of the pedestal 26. In this embodiment, the frame 24 supporting the reflector screen 12 depends from the pedestal 26.

As is readily apparent, the alternative embodiments shown in FIGS. 13 and 14 are but two examples of various designs of the loudspeaker system 10 of the present invention. In any such embodiment, the treble and mid-range speakers 18, 20 must be positioned in front of the reflective surface 14 a longitudinal component of distance along the central axis 16 less than the pre-determined distance x to accomplish the desired result of uniform disbursement of reflected sound waves. As described above, the pre-determined distance x is set by the configuration of the complex curve of the reflective surface 14. Moreover, to eliminate distortion associated with reflected low-frequency sound waves, sound waves below a pre-determined frequency must be projected into the listening area rather than reflected off the reflective surface 14. In the present invention, the pre-determined frequency is 800 hertz. However, this frequency can be varied slightly without losing the desired results of high quality sound reproduction.

In the alternative embodiment of the invention shown in FIG. 13, only one conventional bass speaker 22 is employed. The bass speaker 22 is a sub-woofer manufactured by Vieta and designated by part number L120XAL which reproduces sound waves below 120 hertz. The conventional treble speakers 18 in this embodiment are sealed tweeters manufactured by Focal and designated by part number T90T1 which reproduce sound waves above 3800 hertz. The conventional mid-range speakers 20 in this embodiment are manufactured by Focal and are designated by the part number 5K013L which reproduce sound waves in the range 120 to 3800 hertz. As previously described, the reproduction of sound waves of various frequencies by the speakers 18,20,22 is accomplished by the use of standard electronic crossover circuitry.

In the alternative embodiment of the invention shown in FIG. 14, the conventional bass speakers 22 are woofers manufactured by Focal and designated by part number 8K516 which reproduce sound waves below 400 hertz. The conventional treble speakers 18 in this embodiment are sealed tweeters manufactured by Focal and designated by part number T90T1 which reproduce sound waves above 3800 hertz. The conventional mid-range speakers 20 in this embodiment are manufactured by Focal and are designated by the part number 5K013L which reproduce sound waves in the range 400 to 3800 hertz. As previously described, the reproduction of sound waves of various frequencies by the speakers 18,20,22 is accomplished by the use of standard electronic crossover circuitry.

Referring now to FIG. 15, a block-diagram of the method of disbursing sound waves is shown. The method comprises the steps of providing a reflector screen 12 having a reflective surface 14 and a central axis 16, as described above, and positioning speakers 18,20,22. The speakers 18,20 for producing sound waves above a pre-determined frequency are positioned in front of the reflective surface 14 a longitudinal component of distance along the central axis 16 less than a pre-determined distance x, determined as described above. The method also includes the steps of projecting sound waves from the speakers 18,20 toward the reflective surface 14 and projecting sound waves from the speakers 22 into a listening area generally. The method finally includes reflecting the sound waves projected by speakers 18,20 off of the reflective surface 14 to be uniformly disbursed into the listening area. Projecting sound waves from the speakers 22 into the listening area generally eliminates distortion associated with the reflection of low-frequency sound waves.

It is to be understood that the embodiments of this invention as shown and described are preferred examples and that the invention is not to be limited to the exact arrangement of parts shown in the accompanying drawings or described in this specification. Various changes in the details of construction and shape of the elements of the preferred embodiments may be made without departing from the spirit of the invention. The scope of the novel concepts of the invention are defined in the following claims.

What is claimed is:

1. A loudspeaker system comprising:

a reflector screen having a concave reflective surface, the reflective surface being generally symmetrical about a vertical plane and a horizontal plane respectively, the vertical and horizontal planes intersecting along a central axis, wherein a line normal to the reflective surface at substantially all regions thereon intersects both the vertical and horizontal planes at a vertical intersection point and a horizontal intersection point respectively, the vertical and horizontal intersection points being spaced in front of the reflective surface a longitudinal distance along the central axis greater than a predetermined distance;

a first speaker positioned in front of the reflective surface of the screen a longitudinal distance along the central axis less than the predetermined distance, wherein the first speaker projects sound waves about a pre-determined frequency toward the reflective surface of the screen to be reflected off of the reflective surface and uniformly disbursed into a listening area;

a second speaker positioned to project sound waves below the pre-determined frequency into the listening area; and means for supporting the screen relative to the first and second speakers.

2. The loudspeaker system of claim 1 wherein the pre-determined frequency is at least 120 hertz.

3. The loudspeaker system of claim 1 wherein the predetermined distance is approximately 0.75 to 2.0 feet.

4. The loudspeaker system of claim 1 wherein the first and second speakers are conventional treble and bass speakers, respectively.

5. The loudspeaker system of claim 1 wherein the reflective surface of the screen is constructed from a rigid plastic.

6. The loudspeaker system of claim 1 wherein the reflective surface of the screen is constructed from fiberglass.

7. The loudspeaker system of claim 1 wherein the means for supporting the screen comprises:

a frame for holding the screen in a generally vertical orientation relative to ground; and a pedestal for positioning the first speaker in front of the reflective surface of the screen.

8. The loudspeaker system of claim 1 wherein sound waves from the second speaker are projected directly into the listening area.

9. The loudspeaker system of claim 1 wherein the reflective surface has a complex curvature wherein substantially all radii of curvature of the reflective surface in a plurality of vertical planes are smaller than substantially all radii of curvature of the reflective surface in a plurality of horizontal planes so that vertical disbursement of the high-frequency sound waves is minimized.

10. A loudspeaker system for use in conjunction with a room having a ceiling and floor, the loudspeaker system comprising:

a reflector screen having a concave reflective surface, the reflective surface having a complex curvature wherein substantially all radii of curvature of the reflective surface in a plurality of vertical planes are smaller than substantially all radii of curvature of the reflective surface in a plurality of horizontal planes, the reflective surface also being generally symmetrical about a vertical plane and a horizontal plane respectively, the vertical and horizontal planes intersecting along a central axis, wherein a line normal to the reflective surface at substantially all regions thereon intersects both the vertical and horizontal planes at a vertical intersection point and a horizontal intersection point respectively, the vertical and horizontal intersection points being spaced in front of the reflective surface a longitudinal distance along the central axis greater than a predetermined distance;

at least one high-frequency speaker positioned in front of the reflective surface of the screen a longitudinal distance along the central axis less than the predetermined distance to project high-frequency sound waves above a pre-determined frequency toward the reflective surface of the screen so that the high-frequency sound waves are reflected off the reflective surface, wherein the disbursement of the reflected high-frequency sound waves toward the ceiling and floor of the room is minimized by the radii of curvature of the reflective surface in the plurality of horizontal planes;

at least one low-frequency speaker positioned to project low-frequency sound waves below the pre-determined frequency into the room generally;

means for supporting the screen relative to the at least one high and low-frequency speakers.

11. The loudspeaker system of claim 10 further comprising means for dividing an electrical signal generated by a stereo system such that the at least one high-frequency speaker produces sound waves above the predetermined frequency and the at least one low-frequency speaker produces sound waves below the predetermined frequency.

12. The loudspeaker system of claim 10 wherein the pre-determined frequency is at least 120 hertz.

13. The loudspeaker system of claim 10 wherein the predetermined distance is approximately 0.75 to 2.0 feet.

14. The loudspeaker system of claim 10 wherein the at least one high-frequency speaker comprises a conventional treble speaker and a conventional mid-range speaker, the speakers having a generally vertical orientation relative to ground.

15. The loudspeaker system of claim 10 wherein the at least one low-frequency speaker comprises a conventional bass speaker.

16. The loudspeaker system of claim 10 wherein the reflective surface of the screen is constructed from a rigid plastic.

17. The loudspeaker system of claim 10 wherein the reflective surface of the screen is constructed from fiberglass.

18. The loudspeaker system of claim 10 wherein the means for supporting the screen comprises:

a frame for holding the screen in a generally vertical orientation relative to ground; and a pedestal for positioning the at least one high-frequency speaker in front of the reflective surface of the screen.

19. The loudspeaker system of claim 10 wherein sound waves from the at least one low-frequency speaker are projected directly into the listening area.

20. A loudspeaker system for use in conjunction with a room having a ceiling and floor, the loudspeaker system comprising:

a rigid plastic reflector screen having a concave reflective surface, the reflective surface having a complex curvature wherein substantially all radii of curvature of the reflective surface in a plurality of vertical planes are smaller than substantially all radii of curvature of the reflective surface in a plurality of horizontal planes, the reflective surface also being generally symmetrical about a vertical plane and a horizontal plane respectively, the vertical and horizontal planes intersecting along a central axis, wherein a line normal to the reflective surface at substantially all regions thereon intersects both the vertical and horizontal planes at a vertical intersection point and a horizontal intersection point respectively, the vertical and horizontal intersection points being spaced in front of the reflective surface a longitudinal distance along the central axis greater than approximately 0.75 to 2.0 feet;

a pair of treble and mid-range speakers, the treble and mid-range speakers oriented generally vertically relative to ground and positioned in front of the reflective surface of the screen a longitudinal distance along the central axis less than approximately 0.75 to 2.0 feet to project sound waves above at least 400 hertz toward the reflective surface of the screen so that the sound waves are reflected off of the reflective surface, wherein the disbursement of the reflected sound waves toward the ceiling and floor of the room is minimized by the radii of curvature of the reflective surface in the plurality of horizontal planes;

a pair of bass speakers positioned to project sound waves below at least 400 hertz directly into the room;

means for dividing an electrical signal generated by a stereo system such that the treble and mid-range speakers produce sound waves above at least 400 hertz and the base speakers produce sound waves below at least 400 hertz;

a frame connected to the bass speakers for holding the screen in a generally vertical orientation relative to ground; and a pedestal for positioning the treble and mid-range speakers in front of the reflective surface of the screen.

21. A method of disbursing sound waves into a listening area, the method steps comprising:

providing a reflector screen having a concave reflective surface, the reflective surface being generally symmetrical about a vertical plane and a horizontal plane respectively, the vertical and horizontal planes intersecting along a central axis, wherein a line normal to the reflective surface at substantially all regions thereon intersects both the vertical and horizontal planes at a vertical intersection point and a horizontal intersection point respectively, the vertical and horizontal intersection points being spaced in front of the reflective surface a longitudinal distance along the central axis greater than a predetermined distance;

positioning a first speaker in front of the reflective surface of the screen a longitudinal distance along the central axis less than the predetermined distance to project sound waves above a pre-determined frequency toward the reflective surface of the screen;

positioning a second speaker to project sound waves below the pre-determined frequency into the listening area;

projecting sound waves above the pre-determined frequency from the first speaker toward the reflective surface of the screen;

projecting sound waves below the pre-determined frequency from the second speaker into the listening area;

reflecting sound waves from the first speaker off of the reflective surface of the screen to be disbursed into the listening area.

22. The method of claim 21 further comprising the method step or dividing an electrical signal generated by a stereo system such that the first speaker produces sound waves above the predetermined frequency and the sound speaker produces sound waves below the predetermined frequency.

23. The method of claim 22 wherein the method step of dividing an electrical signal includes setting the predetermined frequency at a level of at least 120 hertz.

24. The method of claim 21 wherein the method step of positioning the first speaker includes placing a treble speaker in front of the reflective surface of the screen with a generally vertical orientation relative to ground.

25. The method of claim 21 wherein the method steps of projecting sound waves above the pre-determined frequency and projecting sound waves below the predetermined frequency include sending an electrical signal to the first and second speakers.

26. The method of claim 21 wherein the method step of reflecting includes providing the reflective surface with a complex curvature wherein substantially all radii of curvature of the reflective surface in a plurality of vertical planes are smaller than substantially all radii of curvature of the reflective surface in a plurality of horizontal planes so that disbursement of sound waves above the pre-determined frequency toward the floor and ceiling of the room is minimized.

27. The method of claim 21 wherein the method steps of providing a reflector screen and positioning a first speaker include setting the longitudinal distance along the central axis at approximately 0.75 to 2.0 feet.

* * * * *